United States Patent [19]

Yoon

[11] Patent Number: 5,652,584
[45] Date of Patent: Jul. 29, 1997

[54] DATA FORMAT CONVERTER

[75] Inventor: Ju Young Yoon, Kyoungkido, Rep. of Korea

[73] Assignee: Hyundai Electronics Industries Co., Ltd., Kyoungkido, Rep. of Korea

[21] Appl. No.: 564,552

[22] Filed: Nov. 29, 1995

[30] Foreign Application Priority Data

Dec. 14, 1994 [KR] Rep. of Korea ............ 1994-34272

[51] Int. Cl.⁶ .................................................. H03M 7/00
[52] U.S. Cl. ...................... 341/89; 341/50; 364/715.03
[58] Field of Search ................... 364/715.03; 341/50, 341/89

[56] References Cited

U.S. PATENT DOCUMENTS

| | | | |
|---|---|---|---|
| 4,583,180 | 4/1986 | Kmetz | 364/715 |
| 4,700,319 | 10/1987 | Steiner | 364/518 |
| 4,720,809 | 1/1988 | Taylor | 364/748 |
| 4,858,163 | 8/1989 | Boreland | 364/715.03 |
| 5,161,117 | 11/1992 | Waggener, Jr. | 364/715.03 |
| 5,365,465 | 11/1994 | Larson | 364/715.03 |

*Primary Examiner*—Jeffrey A. Gaffin
*Assistant Examiner*—Jason L. W. Kost
*Attorney, Agent, or Firm*—Keck, Mahin & Cate

[57] ABSTRACT

A data format converter for executing log conversion, anti-log conversion, floating point conversion and inverse floating point conversion in an adaptive differential pulse code modulation (ADPCM) processor, which has an excellent data format conversion speed.

2 Claims, 2 Drawing Sheets

5,652,584

DATA FORMAT CONVERTER

BACKGROUND OF THE INVENTION

The present invention relates to a data format converter, and more particularly, to a data format converter for executing log conversion, antilog conversion, floating point conversion and inverse floating point conversion in an adaptive differential pulse code modulation (ADPCM) processor.

In general, an adaptive differential pulse code modulator is an element for extending channel capacity in an audio codec, a sound card, a digital signal processor and a wireless communication.

In order for an adaptive pulse code modulator to carry out ADPCM, a data format conversion of sign magnitude (SM) data, that is, log conversion, antilog conversion, floating point conversion and inverse floating point conversion should be executed.

That is, it may convert 16 bit SM data into log data and floating point data so as to execute ADPCM. And, it may execute antilog conversion for converting log data having a 4 bit exponent and a 7 bit mantissa into 16 bit SM data of a linear region.

In a prior art, complicate algorithms have been executed using a specific software routine of a general DSP chip.

For example, the following algorithm equation is used so as to convert said SM data into log data using software $$\log_2 X = 4.0(-0.3372223X^2 + 0.9981958X - 0.6626105)$$

However, in case said algorithm is executed using software, software routine demands many macro codes and many hours for executing it are thereby required. It has a disadvantage in that the format conversion speed becomes slow.

SUMMARY OF THE INVENTION

It is an object of the present invention to provide a data format converter which can improve the process speed by executing log conversion, antilog conversion, floating point conversion and inverse floating point conversion using hardware.

To accomplish the object of the present invention, there is provided a data format converter, for converting a data format in accordance with a first control signal for controlling log conversion or antilog conversion and a second control signal for controlling floating point conversion or inverse floating point conversion, the data format converter comprising: exponent generation means for inputting sign magnitude data and searching a leading-one position from the sign magnitude data and outputting an exponent of log data according to searching result; a first storing means for temporarily storing the exponent of log data from the exponent generation means and a mantissa of log data to be formed hereinafter; 1-adding means for inputting the mantissa of log data from the first storing means and adding one into the upper 1 bit than the most significant bit; selecting means for selecting one of outputs of the 1-adding means and said sign magnitude data in accordance with the first control signal; shifting means for shifting output data of said selecting means by the predetermined bits in accordance with the exponent of log data from said exponent generation means and the first control signal; multi-output means for inputting output data from said shifting means and outputting the mantissa of log data and sign magnitude data; increment/decrement means for increasing the exponent of log data by 1 and outputting it as an exponent of the floating point data, or for decreasing an exponent of floating point data by 1 and outputting it as an exponent of log data in accordance with said second control signal; and second storing means for storing the exponent of floating point data from the increment/decrement means and the mantissa of floating point data that 1 is added to the upper 1 bit than the most magnificent bit of the mantissa of log data and then the least significant bit of said mantissa of log data is deleted.

BRIEF DESCRIPTION OF THE ATTACHED DRAWINGS

FIG. 1 is a block diagram of a data format converter in accordance with an embodiment of the present invention; and FIG. 2 is a detailed block diagram of a shifter part of FIG. 1.

DETAILED DESCRIPTION OF THE INVENTION

Hereinafter, the preferred embodiment of a data format converter in accordance with the present invention will be described with reference to the attached FIGS. 1 and 2.

Figure 1:
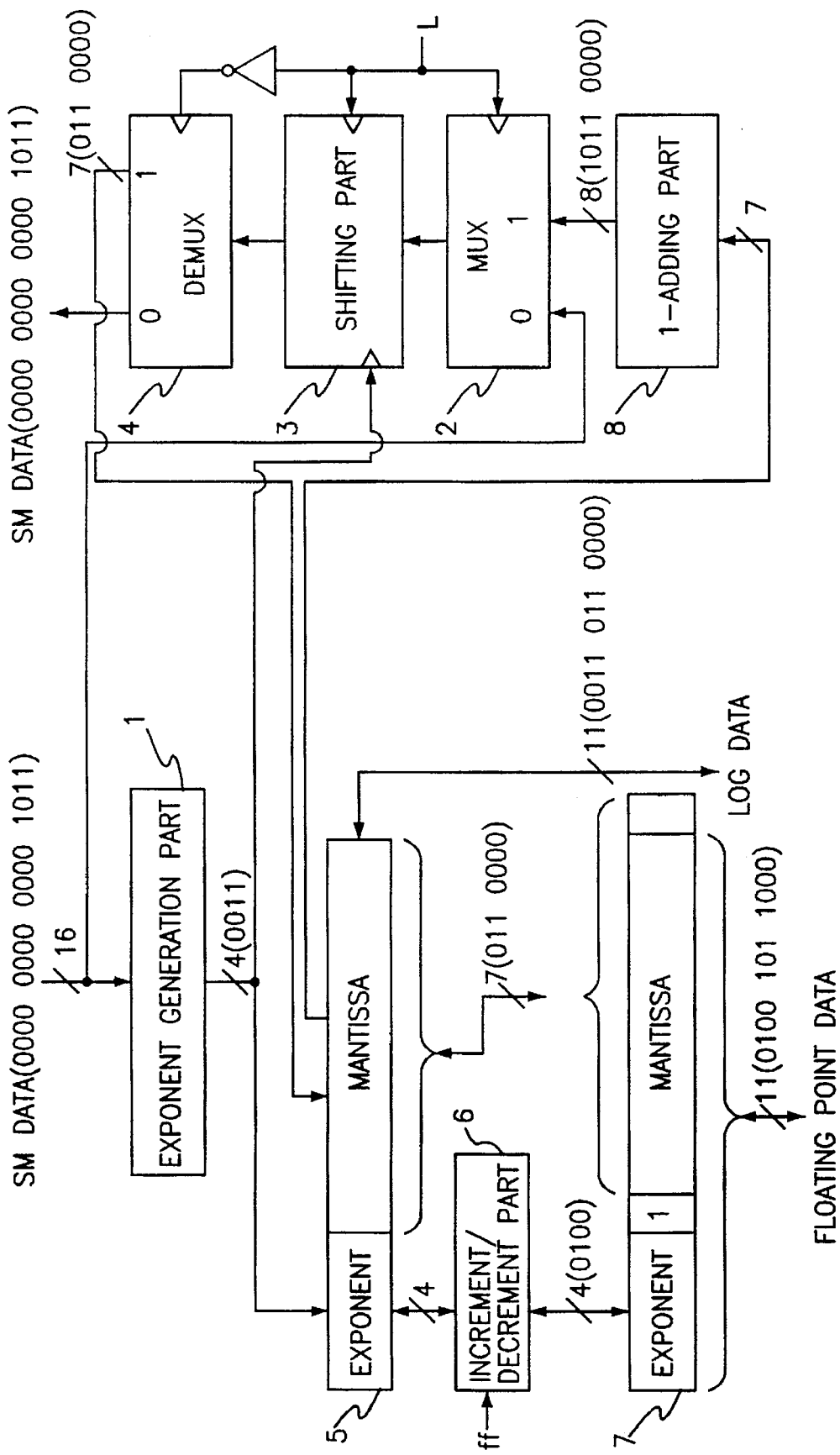

FIG. 1 is a block diagram of the converter which is controlled by the interior control signals L and ff of an adaptive differential pulse code modulator and converts a data format of 16 bit sign magnitude data.

A first control signal L of the interior control signals controls the data format converter to execute log conversion, in case it has '0', and to execute antilog conversion, in case it has '1', respectively, and a second control signal ff controls it to execute floating point conversion, in case it has '0', and to execute inverse floating point conversion, in case it has '1', respectively.

Referring to the drawing, the data format converter comprises an exponent generation part 1 which inputs sign magnitude data and searches a leading-one position and outputs a code value of 4 bits representing the leading-one position. Thus, a log exponent corresponding to the exponent value of log data, register 5 which temporarily stores the 4 bit log exponent from the exponent generation part 1 and a 7 bit log mantissa to be formed hereinafter. Thus, the log data, 1-adding part 8, which inputs the 7 bit log mantissa from the register 5, adds the upper 1 bit than the most significant bit (MSB) of the 7 bit log mantissa and outputs total 8 bit data, a multiplexor 2 which inputs said SM data and output data of the 1-adding part 8 and outputs said SM data in case the first control signal L is '0', and the output data from the 1-adding part 8 in case the first control signal L is '1', a shifting part which shifts the output data of the multiplexor 2 in accordance with the 4 bit log exponent from the exponent generation part 1 and the first control signal L, the demultiplexor 4 which inputs the output data from the shifting part 3 and outputs the inputted data as it is in accordance with the inverting value of the first control signal L. Thus, in case the inverting value of the first control signal is '0' and the lower 7 bit data from the least significant bit (LSB) of the input data to the mantissa part of the register 5 in case it is '1', an increment/decrement part 6 which inputs the exponent of data stored in the register 5, increases the inputted data by 1 and outputs it as a floating point exponent in case the second control signal ff is '0', and decreases the inputted data by 1 and outputs it as a log exponent, and a register 7 which temporarily stores the floating point exponent from the increment/decrement part 6 and the mantissa of the floating point data that 1 is added to the upper 1 bit than MSB of 7 bit data corresponding to the mantissa from the register 5 and the LSB of 7 bit data is deleted.

At this constant, because the 16 bit SM data from the exponent generation part 1 is the data of the operation result, it is 2's complement. If the sign bit of the inputted data is negative, 2's complement of said inputted data should be again taken and be applied to the exponent generation part 1 and the multiplexor 2.

Figure 2:
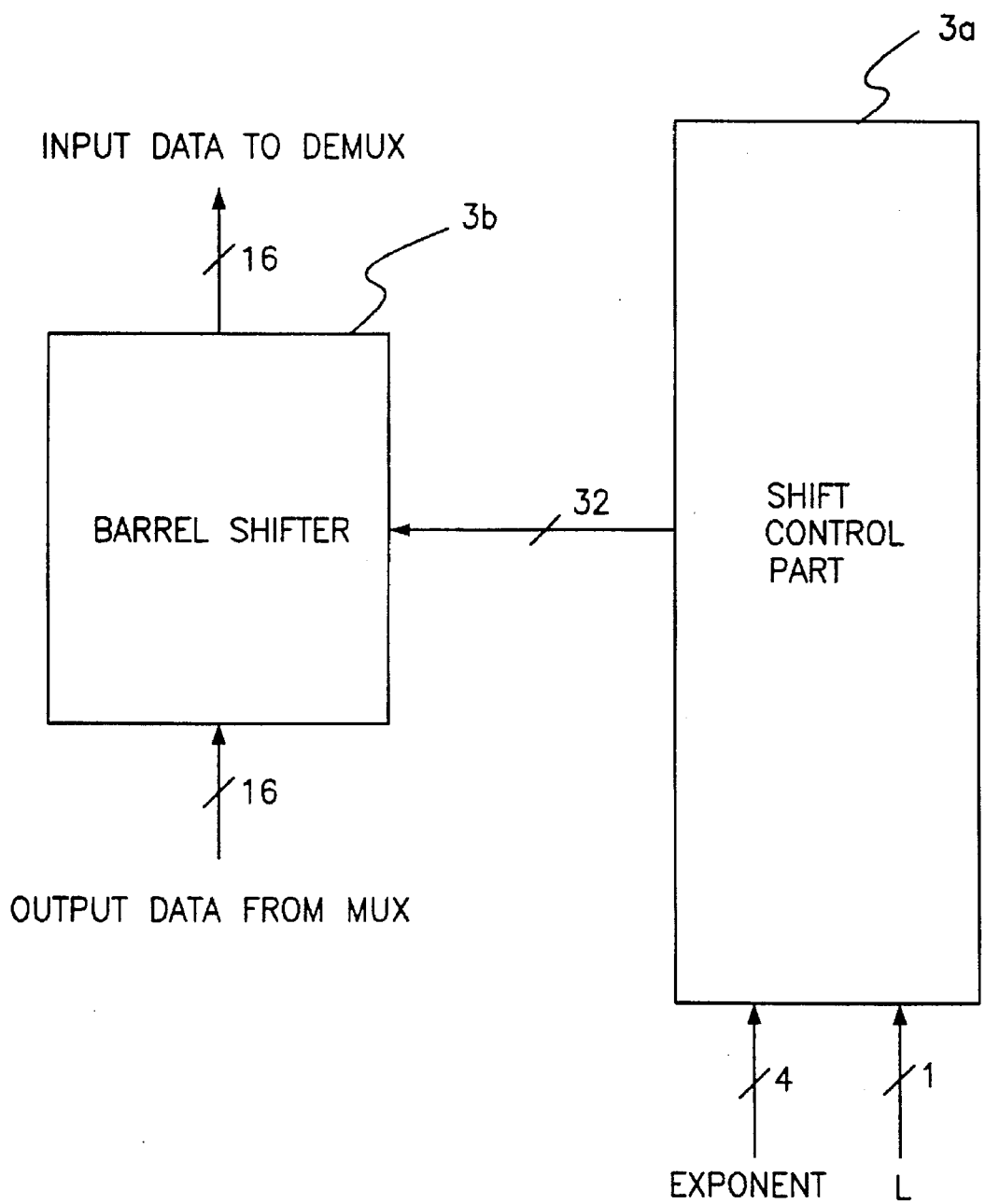

FIG. 2 is a detailed block diagram of the shifting part 3 in FIG. 1. Referring to FIG. 2, said shifting part 3 includes a shifting control part 3a, which inputs the 4 bit exponent from the exponent generation part 1, and the first control signal L, which is an interior control signal, and outputs 32 shift control signals in accordance with the combination of them and a barrel shifter 3b, which shifts the 16 bit output data from the multiplexor 2 in accordance with the shift control signals of the shifting control part 3a, and outputs the shifted data to the demultiplexor 4.

In case the SM data is total 16 bit data, the shifting control part 3a outputs 16 shift control signals in right-shifting and 16 shift control signals in left-shifting, thus it outputs a total of 32 shift control signals, as shown in <Table 1>.

TABLE 1

| exponent | shift control signal | |
|---|---|---|
| | L = 1 | L = 0 |
| 0 | >>7 | <<7 |
| 1 | >>6 | <<6 |
| 2 | >>5 | <<5 |
| 3 | >>4 | <<4 |
| 4 | >>3 | <<3 |
| 5 | >>2 | <<2 |
| 6 | >>1 | <<1 |
| 7 | 0 | 0 |
| 8 | <<1 | >>1 |
| 9 | <<2 | >>2 |
| 10 | <<3 | >>3 |
| 11 | <<4 | >>4 |
| 12 | <<5 | >>5 |
| 13 | <<6 | >>6 |
| 14 | <<7 | >>7 |
| 15 | <<8 | >>8 |

In <Table 1>, the symbols >> and << designate shift-right and shift-left, respectively. Thus, >> 7 is a shift control signal for shifting the input data by 7 bits to the right.

The exponent generation part 1 and the shifting control part 3a are embodied by using a programmable logic array (PLA).

Next, the operation and effect of the present invention as above configured will be described in detail.

If 16 bit SM data, for example 0000 0000 0000 1011 (binary data), is applied to the exponent generation part 1, the exponent generation part 1 searches a leading-one position from MSB and outputs a 4 bit exponent value according to the searching result. Thus, the leading-one is positioned at the fourth bit and the exponent generation part 1 outputs 0011.

On the other hand, when the first control signal L is '0', thus in case of log conversion, 16 bit SM data is applied to the shifting part 3 through the multiplexor 2. According to this, 16 bit SM data is left-shifted by 4 bits by a control signal in accordance with combination of the exponent value and the first control signal L, as shown in <Table 1>. Accordingly, the shifting part 3 outputs 0000 0000 1011 0000 to the demultiplexor 4.

The demultiplexor 4 outputs the lower 7 bits from LSB of the output data of the shifting part 3, thus, 011 0000 by the inverted control signal L and the data is stored in the mantissa part of the register 5. Accordingly, the register 5 has the log exponent from the exponent generation part 1 and the mantissa, thus, 0011 011 000 of a log conversion value.

On the other hand, when the second control signal ff is '1', thus, in case of floating point conversion, the increment/decrement increases the log exponent stored in the register 5 by 1 and outputs 0100 and this data is stored in the exponent part of the register 7.

The register 7 absolutely stores 1 at the fifth bit and the floating point exponent thereof stores 6 bit data of said log mantissa stored in the register 5 except LSB, thus, 011 000. Accordingly, the register 7 stores 0100 101 1000 of the floating point data.

On the contrary, antilog conversion or inverse floating point conversion is inversely carried out with said log conversion or floating point conversion.

Thus, in case of antilog conversion, the 1-adding part 8 adds 1 to MSB of 011 0000 stored in a log mantissa of the register 5. Thus, the 1-adding part 8 outputs 1011 0000 to the multiplexer 2.

The multiplexor 2 outputs the data applied by the first control signal L to the shifting part 3. At this constant, the data applied to the shifting part 3 becomes 0000 0000 1011 0000 of 16 bits.

The data applied to the shifting part 3 is right-shifted by 4 bits by a control signal in accordance with the combination of the exponent value of the exponent generation part 1 and the first control signal L, as shown in <Table 1>. Accordingly, the shifting part 3 outputs 0000 0000 0000 1011 and the data is outputted as the final SM data through the demultiplexor 4 under the control of the inverted first control signal L.

On the other hand, in case of inverse floating point conversion, the increment/decrement part 6 decreases the log exponent stored in the register 7 by 1 in accordance with the second control signal ff, and outputs 0011 and the data is stored in the floating point exponent part of the register 5.

The mantissa part of the register 5 inputs and stores 011 000 that is made by inserting 0 into LSB of the floating point mantissa of 6 bits except for 1 of the fifth bit, which is stored in the register 7. Accordingly, the register 7 has 0011 011 0000 of floating point data.

On the other hand, in case the inputted data has 2's complement, said conversion procedure is carried out after converting the inputted data into a SM format.

According to the present invention, log conversion, antilog conversion, floating point conversion and inverse floating conversion are carried out using hardware, so that the data format conversion speed is excellent.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A data format converter for converting a data format in accordance with a first control signal for controlling log conversion or antilog conversion, and a second control signal for controlling floating point conversion or inverse floating point conversion, the data format converter comprising:

exponent generation means for inputting sign magnitude data and searching a leading-one position and outputting an exponent of log data according to searching result;

first storing means for temporarily storing the exponent of log data from the exponent generation means and a mantissa of log data to be formed hereinafter;

1-adding means for inputting the mantissa of log data from the first storing means and adding one into the upper 1 bit than the most significant bit;

selecting means for selecting one of the outputs of the 1-adding means and said sign magnitude data in accordance with the first control signal;

shifting means for shifting output data of said selecting means by a predetermined bits in accordance with the exponent of log data from said exponent generation means and the first control signal;

multi-output means for inputting output data from said shifting means and outputting sign magnitude data or the mantissa log data;

increment/decrement means for increasing the exponent of log data by 1 and outputing it as an exponent of the floating point data, or for decreasing an exponent of floating point data by 1 and outputting it as an exponent of log data in accordance with said second control signal; and second storing means for storing the exponent of the floating point data from the said increment/decrement means and the mantissa of floating point data that 1 is added to the upper 1 bit than the most significant bit of the mantissa of log data and the lease significant bit is deleted.

2. The data format converter as claimed in 1, wherein said shifting means includes;

shift control means for inputting the exponent of log data from said exponent generation means and the first control means and outputting shift control signals in accordance with the combination of them; and a barrel shifter for shifting output data of said selecting means by a predetermined bits in accordance with the shift control signals of said shifting control means.

* * * * *